United States Patent [19]
Evans

[11] 3,930,809
[45] Jan. 6, 1976

[54] ASSEMBLY FIXTURE FOR FIXED POINT PROBE CARD
[75] Inventor: Arthur Evans, Brookfield Center, Conn.
[73] Assignee: Wentworth Laboratories, Inc., Brookfield, Conn.
[22] Filed: July 15, 1974
[21] Appl. No.: 488,403

Related U.S. Application Data
[62] Division of Ser. No. 390,184, Aug. 21, 1973, Pat. No. 3,849,728.

[52] U.S. Cl. .................. 29/203 J; 228/6; 228/49; 324/158 F
[51] Int. Cl.² .................. B23K 1/14; H05K 1/18
[58] Field of Search ............. 324/158 F, 158 P; 29/203 R, 203 B, 203 J, 203 P, 626; 228/6, 49, 179, 212

[56] References Cited
UNITED STATES PATENTS
3,445,770  5/1969  Harmon ..................... 324/158 P
3,738,560  6/1973  Kulicke, Jr. et al. ............ 29/203 P Primary Examiner—R. V. Rolinec
Assistant Examiner—Ernest F. Karlsen

[57] ABSTRACT

A fixture for assembling a probe card adapted to test integrated circuit patterns having contacts deployed thereon. The card includes an opening providing access to a pattern and a ring of spaced conductive pads surrounding the opening. Anchored on selected pads are blade-like needle-holders having needles extending therefrom to engage the contacts in the pattern being tested. The fixture is designed to facilitate attachment of each needle-holder blade to its pad on the card and to orient the blade before such attachment so that the needle point is precisely aligned with the related contact.

6 Claims, 13 Drawing Figures

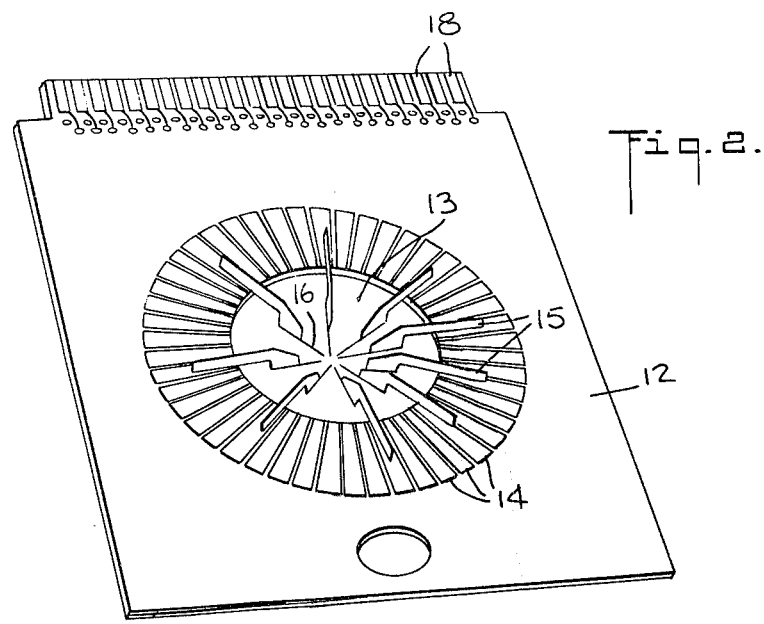
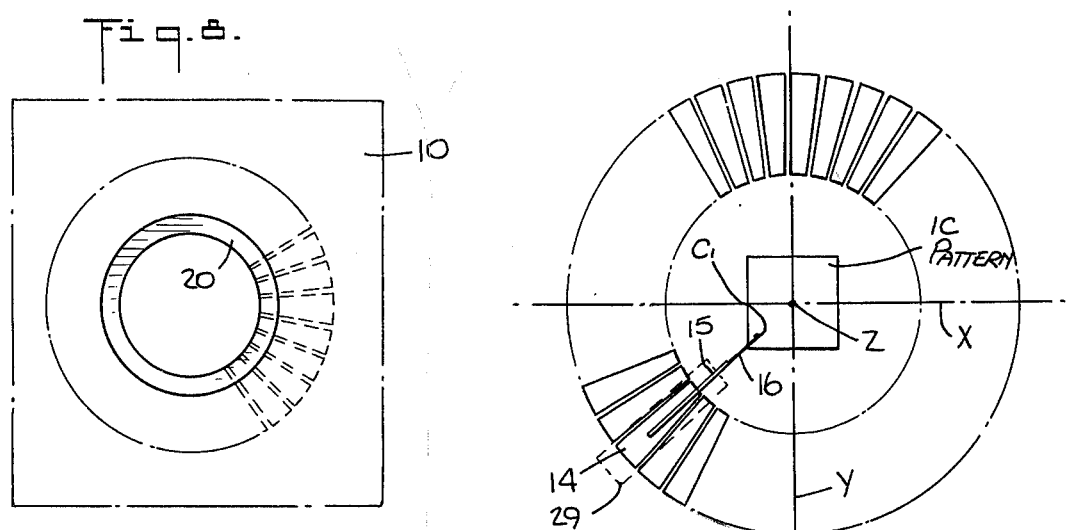
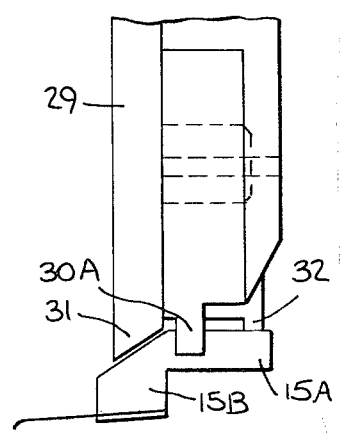
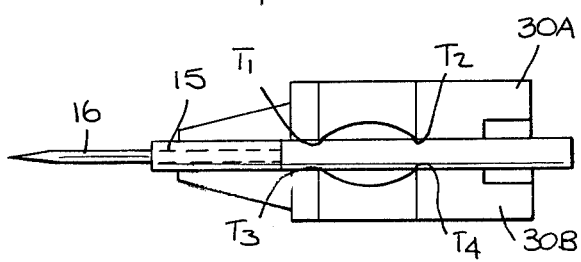

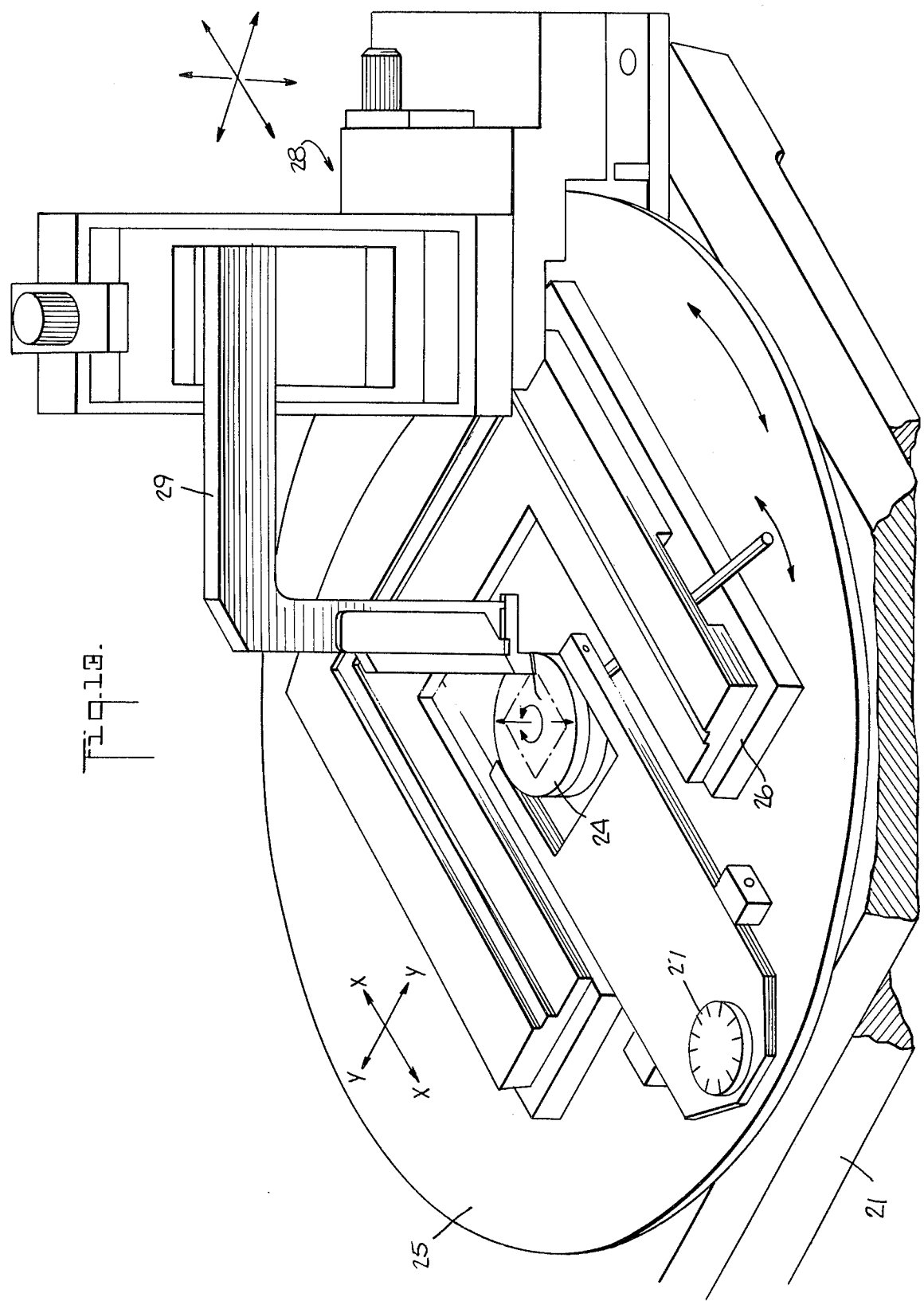

ASSEMBLY FIXTURE FOR FIXED POINT PROBE CARD

RELATED APPLICATION

This application is a division of the copending application of Evans, Ser. No. 390,184, filed Aug. 21, 1973, now U.S. Pat. No. 3,849,728, entitled Fixed Point Probe Card and Assembly and Repair Fixture Therefor.

BACKGROUND OF THE INVENTION

This invention relates generally to the testing of integrated circuits, and, in particular, to a fixture for assembling and repairing fixed point probe cards for facilitating such tests.

Many circuits and complex multi-stage electronic systems that previously were regarded as economically unfeasible and impractical are now realizable with integrated circuits. The fabrication of a single-crystal monolithic circuit involves the formation of diodes, transistors, resistors and capacitors on a single microelectronic substrate. In practice, a microelectronic substrate for semiconductor integrated circuits is formed on a silicon wafer, the patterns for circuit processing being applied to the wafer by photolithography. Each wafer contains the patterns of many identical integrated circuits. After the patterns are tested, the wafer is sliced into "dice," each die containing a single circuit.

In an integrated circuit (IC) pattern, the input output, power supply and other terminals of the circuit are formed by metallized contacts, usually deployed along the margins of the pattern. The outline of the pattern is either square or rectangular, and the marginal locations of the contact thereon depend on the circuit configuration and the available marginal space. Thus in a relatively simple circuit pattern, all of the marginal space may be available for contacts, whereas in more complex circuits, portions of the circuit may invade the marginal areas so that contact placement is restricted to the free marginal areas. In some instances, therefore, the contacts may lie in more or less uniform rows along the margins, and in other cases, the contacts may be randomly spaced from each other.

For the purpose of testing any type of integrated-circuit patterns, test probe cards have been developed and are now commercially available. Each test probe card consists of a printed circuit board having an opening to provide access to an IC pattern. The opening is surrounded by a ring of conductive pads connected by the printed circuit to card terminals for connection to test equipment appropriate to the circuit. The number of pads in the ring determine the maximum capacity of the probe card. If, for example, the card has 48 pads, it is capable of testing IC patterns having 48 contacts or less.

In setting up a probe card for a particular IC pattern, probes in the form of needles of tungsten are affixed to selected pads, the needles extending over the opening. The length and orientation of each needle is such that its point is adapted to engage a respective contact on the IC pattern.

Let us assume, by way of example, a very simple IC pattern lying within a rectangular outline and having five contacts at different marginal positions, such as two contacts adjacent on the upper and lower left corners of the rectangle and one contact adjacent to the lower right corners.

To assemble a probe card for this five contact, IC pattern, one must attach needles to those pads which are most conveniently located with respect to the contacts, and since the pattern is rectangular whereas the pads lie in a circular array, the stretch of each needle depends on the distance between its pad and the particular contact to be engaged. Hence the needles in a conventional probe card vary in length.

Since all of the contacts in the IC pattern lie in a common plane, and must be simultaneously engaged in order to carry out testing, it is essential that all needle points lie in a plane parallel to the common IC plane. Consequently, a fundamental requirement of a probe card is planarization of the needle points. The nature of conventional probe cards and the character of the assembly fixtures for setting up the probe positions for such cards are such that it is virtually impossible to assemble probes with needle points lying exactly in the same plane.

SUMMARY OF THE INVENTION

In view of the foregoing, it is the main object of this invention to provide a fixture for assembling and repairing a fixed probe card in which all probe needles have points lying precisely in the same plane, all needles producing the same optimum contact force whereby positive connections are made with all contacts on the IC pattern being tested without damage to the contacts.

Briefly stated, in a fixture in accordance with the invention adapted to facilitate assembly and repair of fixed point probe cards, the fixture is provided with a vacuum chuck for presenting a substrate or wafer containing IC patterns, and an X–Y platform mechanism for supporting the card relative to the chuck and for positioning the card with respect to an IC pattern on the wafer, the chuck being adjustable in both the theta and the Z direction whereby the IC pattern may be aligned and raised or lowered relative to the opening in the card.

The fixture also includes an X–Y–Z needle-holder positioning mechanism adapted to grip the holder as well as to orient the holder relative to its pad and the needle point relative to its IC contact so that the probe position may be properly set before the holder is soldered to the pad. At its set position, the holder is slightly raised relative to the pad to render its position independent of any warpage in the board.

OUTLINE OF THE DRAWING

For a better understanding of the invention as well as other objects and features thereof, reference is made to the following detailed description to be read in conjunction with the annexed drawings wherein:

FIG. 2 is a perspective view of a probe card for testing integrated circuit and thin film patterns;

FIG. 3 is a plan view of the underside of the probe card showing the printed circuit for effecting connections between the probes and the card terminals;

FIG. 10 is an enlarged view of the operating table of the fixture shown in FIG. 9;

FIG. 11 is an elevational view of the gripper in the fixture for clamping the needle-holder in the positioning mechanism therefor;

FIG. 12 is a bottom view of the gripper; and

FIG. 13 is a sketch illustrating the operation of the fixture.

DESCRIPTION OF THE INVENTION

Figure 1:
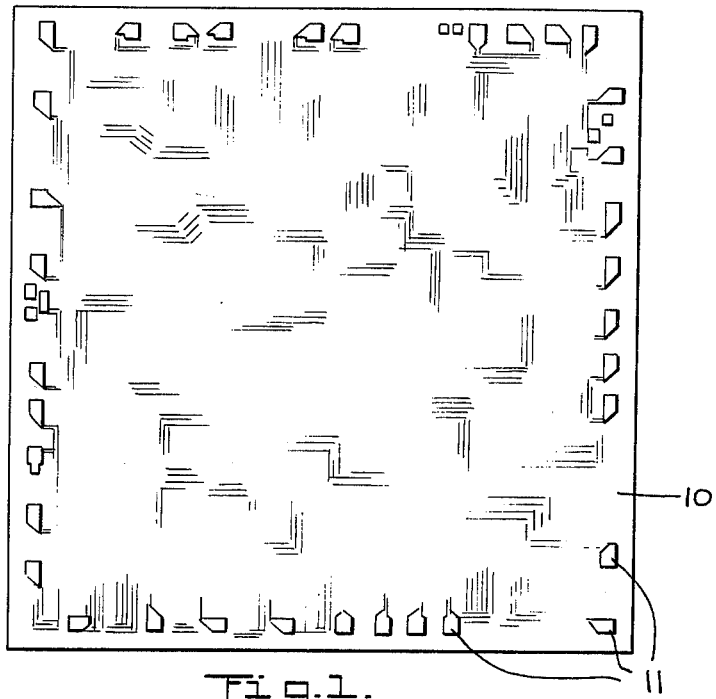
FIG. 1 is a plan view of a typical integrated circuit pattern.

Referring now to FIG. 1, there is shown, in enlarged form, a typical integrated circuit pattern 10 whose actual dimensions are 149 × 150 mils, so that the outline of the pattern is almost square. The IC pattern illustrated is a timing circuit which was integrated from a breadboard containing over a thousand discrete elements.

The contacts 11 of the IC are deployed along the four margins of the pattern, more than thirty contacts being shown. It will be seen that portions of the circuit invade the marginal zones, hence the contacts are placed only in free marginal areas. Several such patterns are fabricated on a common substrate or wafer. The manner of fabricating the wafers forms no part of the present invention.

In order to test an IC pattern of the type shown in FIG. 1 or any other type, a probe card is provided which, as illustrated in FIGS. 2 and 3, includes a printed circuit board 12 having a central opening 13, providing access to the IC pattern to be tested. Opening 13 is surrounded by a ring of equi-spaced conductive pads 14, having a wedge-shaped formation. Cantilevered from selected pads are several probes, each formed by a needle-holder 15 and a needle supported thereby. The probes overlie the opening and are so positioned that the points of the needles occupy the same place and are each in registration with an IC contact in the pattern.

In practice, the array of conductive pads surrounding the opening need not be in a circular formation as shown, nor need the pads be equi-spaced or wedge-shaped. The formation of pads is determined by the configuration of the device to be tested and in some instances, the formation of pads may be oval, generally rectangular or in other appropriate geometric forms.

The number of probes on the card and their respective orientations are determined by the number and placement of the contacts on the IC pattern to be probed. The probe card shown has a ring of 48 pads; hence the maximum capacity of this card is 48. However, if the IC pattern to be tested has, say, 25 contacts, then this card is set up with 25 probes oriented to simultaneously engage all 25 contacts.

The printed circuit or the underside of the card is arranged to connect even-numbered pads 14 to a row of 24 terminals 17 mounted along the edge of the card on the underside, and to connect odd-numbered pads to a like row of terminals 18 secured to the face of the card. Though the card shown has a maximum capacity of 48 probes, in practice the cards may be made with a smaller or larger capacity. In fact, the structure of the probes is such that the card lends itself to an exceptionally large capacity, for the probes are relatively thin and a larger number thereof may be safely crowded into a small space without danger of interference.

Figure 4:
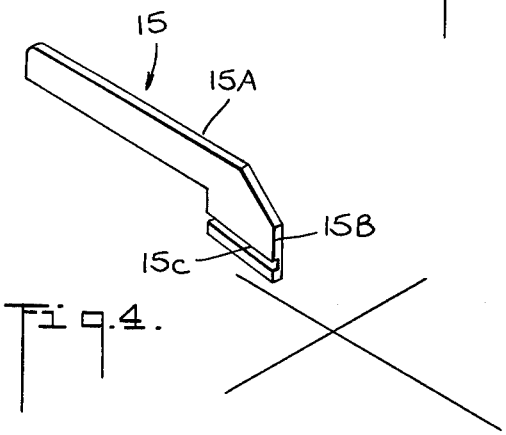
FIG. 4 is a separate perspective view of one of the needle-holders included in the probe card.
Figure 5:
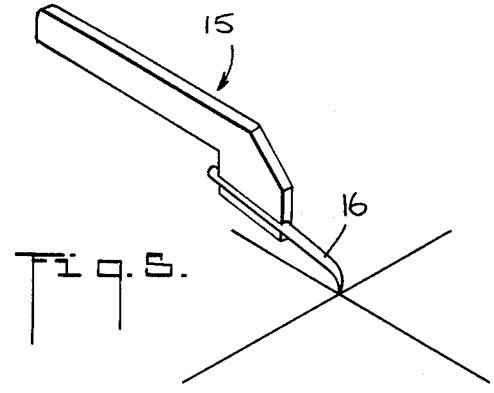
FIG. 5 shows a needle, side mounted in the holder illustrated in FIG. 4.

As shown in FIG. 4, each needle-holder is fabricated from a thin strip of metal, such as brass, which is mounted in the vertical plane, so that the resultant cantilever beam is rigid and highly resistant to deflection. The strip is contoured to define an arm 15A having at its free end a downwardly extending tooth 15B. A slot 15C is formed on one side of tooth 15B, adjacent to the bottom edge thereof, to accommodate the shank of needle 16 which is soldered to the tooth. This slotted-tooth arrangement produces an exceptionally thin probe, making it possible to set up probes in a high density arrangement.

Figure 6:
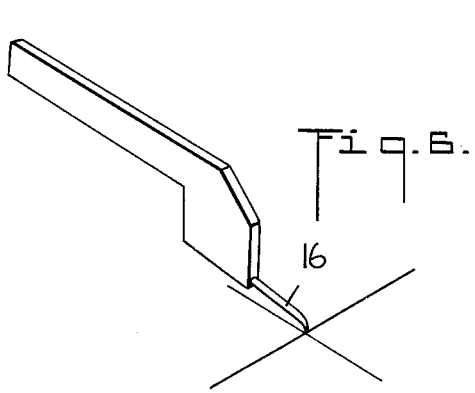
FIG. 6 shows another embodiment of a needle-holder, with a needle bottom-mounted thereon.
Figure 7:
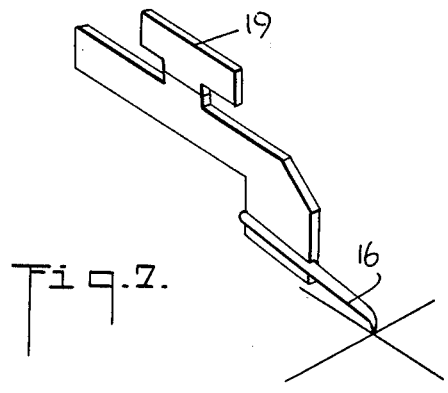
FIG. 7 shows still another embodiment of a needle holder with a breakaway tab.

Alternatively the needle may be soldered to the bottom edge of the tooth, as shown in FIG. 6. In this instance, the holder thickness must be wide enough to accommodate the needle. In FIG. 7, the holder is shown with a break-away tab 19 to facilitate gripping of the needle by the fixture. The tab is broken off after the probe is mounted on a pad.

Figure 8:
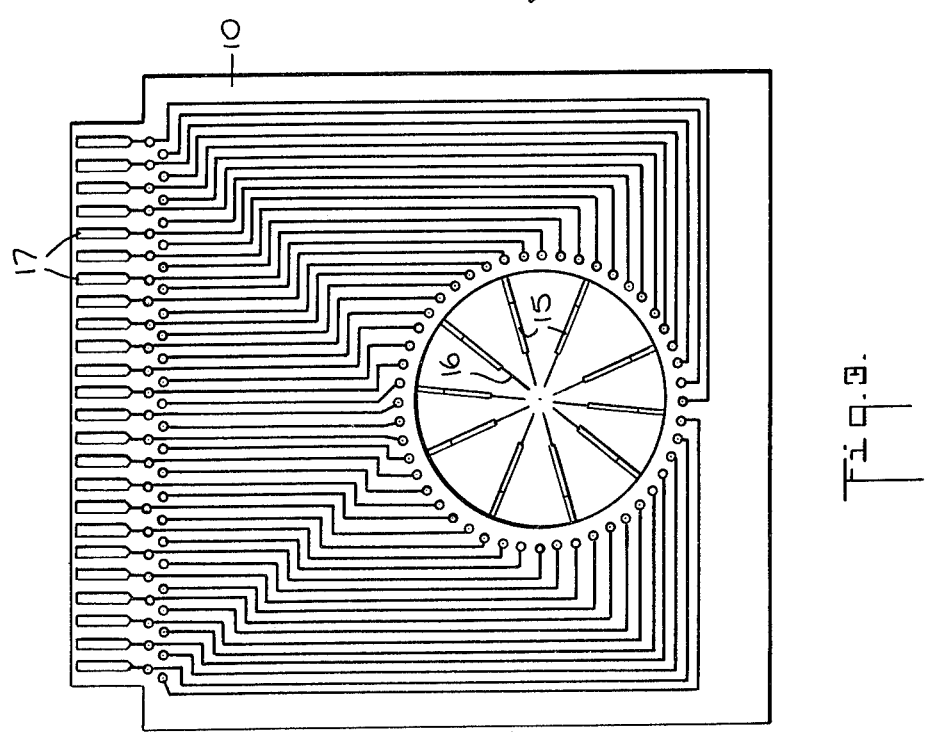
FIG. 8 is a modified form of printed circuit board for a probe card.

FIG. 8 shows only the bottom of a modified printed circuit board for a probe card, and it will be seen that a reinforcing metal washer 20 is provided to encircle the access opening and to rigidify the board to resist warping or distortions thereof which disturb planarization.

Figure 9:
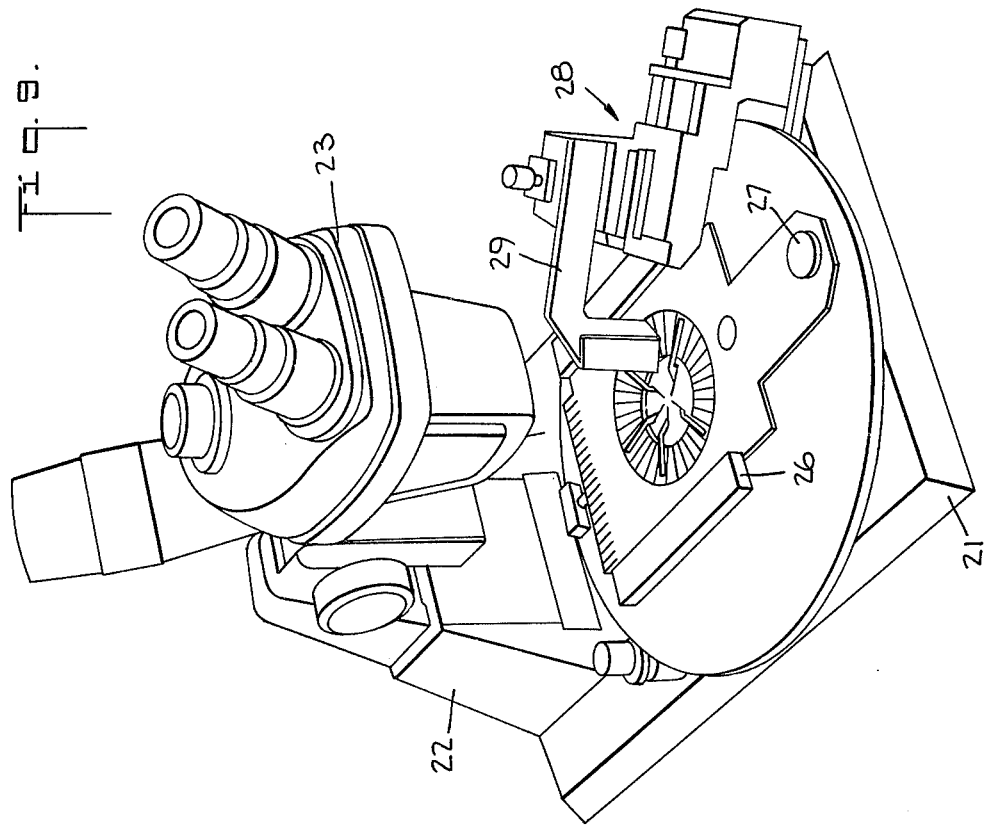
FIG. 9 is a perspective view of a probe card assembly and repair fixture in accordance with the invention.

Referring now to FIGS. 9 and 10, there is shown an assembly and repair fixture serving as a station for setting up probes on probe cards in accordance with the invention. The fixture includes a base 21 having a pedestal 22 mounted thereon for supporting a microscope 23 to permit an operator to observe and thereby control the assembly or repair operation.

Shunted within an opening in the center of base 21 a vacuum chuck 24, onto which a wafer containing several patterns is placed, the wafer being held to the chuck by a suction force. The chuck is surrounded by a rotary turntable 25 on which is supported a platform 26 adapted to receive a probe card PC to be set up. The platform is shiftable in the X and Y directions relative to the chuck by means of a suitable mechanism (not shown), and the chuck may be raised or lowered in the Z direction relative to the card by means including a control knob 27.

Fixedly mounted on platform 21 is a needle-holder X-Y-Z positioning mechanism, generally designated by numeral 28, the mechanism including an L-shaped arm 29 adapted to grip the needle-holder.

The needle-holder positioning mechanism arm 29, as shown separately in FIG. 11, includes at its free end a spring-biased clamp formed by complementary jaw elements 30A and 30B which grip the arm 15A of the needle-holder. The position of the holder is stabilized by a front rest 31 which abuts the inclined top edge of tooth 15B, and a backrest 32 which abuts the rear portion of the upper edge of holder arm 15A.

It will be seen that the jaws are relieved to define two pairs of teeth $T_1$, $T_2$, $T_3$ and $T_4$ directly opposite each other. These teeth resist any movement of the holder, for the teeth grip the holder firmly at spaced positions and prevent bending of the holder. The teeth also minimize physical contact with the holder to avoid a heat sink effect. The reason this avoidance of a heat sink is important is that it allows solder to flow during the soldering operation without drawing heat away from the soldering site.

The needle-holder positioning mechanism is adapted to shift the gripped holder relative to the wafer on the chuck and the pad on the printed circuit card which lies below the gripper arm, in either the X or Y direction, or in the Z direction. The details of the mechanism for effecting X and Y motion and for effecting X–Y–Z motion are not explained, for these are commonplace.

We shall now explain in connection with FIG. 13, the procedure by which a probe is brought into position with respect to a pad 14 in the ring thereof surrounding the access opening 13 so that the point of needle 16 extending from the needle-holder gripped by arm 29 of the X–Y–Z mechanism, is in registration with a particular contact of an IC pattern formed on a wafer held by the chuck.

As pointed out previously, the position of the X–Y–Z needle-holder positioning mechanism is fixed. Hence one must first, by means of the X–Y mechanism for adjusting the card position, shift the card platform 26 in the X and Y directions until the IC pattern on the wafer is centered with respect to opening 13 on the card. Then turntable 25, which carries the platform and the chuck, is turned to radially align contact $C_1$ on the IC pattern with the arm 29 on the needle-holder positioning mechanism.

The holder positioning mechanism is then adjusted in the X and Y directions so that (a) the point on needle 16 is in line in the Z direction with contact $C_1$ and (b) the longitudinal axis of the holder lies about midway along pad 14. At this junction, the holder mechanism is shifted in the Z direction to bring the lower edge of the needle-holder slightly above the pad 14. A shim or spacer may be placed between the pad and the holder to insure a predetermined slight spacing therebetween.

Then the Z mechanism for the chuck is operated to raise the wafer until contact $C_1$ on the IC pattern is engaged by the tip of needle 16 and the needle is slightly deflected to produce a predetermined optimum contact force such as 1.5 grams per mil of deflection. Now the holder may be soldered to the pad to perpetuate the set relationships.

In the procedure described above, the operator depends on the microscope 23 to determine when the tip of the needle engages the contact. This procedure may be facilitated by means of a continuity checker operating with a light indicator, making it possible to train an operator more quickly and also speeding up the production of probe cards. The continuity checker is constituted by a lamp placed under the microscope and operating in conjunction with a low voltage supply (i.e., 10 volts). The circuit between the power supply and the lamp includes a connection between one terminal of the supply and a gripper arm which is insulated from the holder positioning mechanism, and a connection between the other terminal of the supply and the base casting of the fixture. This circuit is completed only when the needle is lowered and touches the contact on the IC device, causing the lamp to light up. Thus when the chuck is raised and the wafer makes contact with the needle, no further Z motion is necessary. If the wafer is non-conductive, a slight deflection of the needle will be noted. Now the holder may be soldered to the pad to perpetuate the set relationship.

In subsequent probe assembly operations, one does not touch the Z control of the chuck, for the first assembly operation establishes a reference for the level of the IC pattern. However, after the holder positioning mechanism is adjusted in the X and Y directions to bring the needle-holder into its proper position with respect to the appropriate pad, the Z control of this mechanism is operated to bring the needle holder down toward the pad to a level slightly spaced therefrom, at which level the needle point engages its related contact. The holder is then soldered to the pad. This procedure is repeated until all contacts on the IC are provided with probes on the card.

While there have been shown and described preferred embodiments of a fixed point probe card and an assembly fixture therefor in accordance with the invention, it will be appreciated that many changes and modifications may be made therein without, however, departing from the essential spirit thereof.

I claim:

1. A fixture for assembling a probe card adapted to test an integrated circuit pattern formed on a substrate, said card including a board having an opening providing access to said pattern and surrounded by an array of conductive pads and probes cantilevered from the pads, each probe being constituted by a needle-holding blade disposed in the vertical plane at a position slightly raised above its associated pad and having a needle extending therefrom to engage a contact on the pattern; said fixture comprising:

A. a chuck for holding said integrated circuit substrate to present the pattern thereof;

B. a platform for supporting said probe card board at a position in which the opening of the board is aligned with the chuck, C. means for shifting said platform in the X and Y directions to orient said array of pads surrounding the board opening relative to the presented pattern, D. an arm for gripping the blade of a probe to be assembled to hold the blade in the vertical plane, and E. means to shift said arm in the X, Y and Z directions to align said blade at a raised position with respect to a selected pad and to align the point of the needle extending from the blade with a contact on said pattern, whereby when the blade is properly oriented it may be soldered to said pad.

2. A fixture as set forth in claim 1, further including means to adjust the position of said chuck in the theta and Z directions to present said substrate.

3. A fixture as set forth in claim 1, wherein said gripping arm is constituted by a pair of jaws which are relieved to define two pairs of opposing teeth which grip the holder at spaced positions to prevent bending thereof without a heat sink effect that inhibits a soldering operation.

4. A fixture as set forth in claim 1, further including a microscope trained on said chuck to facilitate the alignment operations.

5. A fixture as set forth in claim 4, further including a continuity tester to determine where the needle makes electrical and physical connection with a selected contact on said pattern, said tester including a power source connected in series with a light indicator to said arm for gripping the needle-holder, said arm being electrically insulated from said fixture whereby a circuit to said indicator is completed only when said needle makes said connection.

6. A fixture as set forth in claim 5, wherein said indicator is mounted below said microscope whereby one looking through the microscope sees said light when the circuit is completed.

* * * * *